United States Patent
Narita et al.

(10) Patent No.: US 11,131,588 B2
(45) Date of Patent: Sep. 28, 2021

(54) ENERGY CONVERTER, VIBRATION POWER GENERATOR, FORCE SENSOR DEVICE, AND ACTUATOR

(71) Applicants: TOHOKU UNIVERSITY, Sendai (JP); TOHOKU STEEL CO., LTD., Miyagi (JP)

(72) Inventors: Fumio Narita, Sendai (JP); Ryuichi Onodera, Shibata-gun (JP); Tsuyoki Tayama, Shibata-gun (JP); Masahito Watanabe, Shibata-gun (JP); Daiki Chiba, Shibata-gun (JP); Tatsuro Sasa, Shibata-gun (JP); Takenobu Sato, Shibata-gun (JP); Takashi Ebata, Shibata-gun (JP)

(73) Assignees: TOHOKU UNIVERSITY, Miyagi (JP); TOHOKU STEEL CO., LTD., Miyagi (JP)

( * ) Notice: Subject to any disclaimer, the term of this patent is extended or adjusted under 35 U.S.C. 154(b) by 63 days.

(21) Appl. No.: 16/623,118

(22) PCT Filed: Apr. 20, 2018

(86) PCT No.: PCT/JP2018/016247
§ 371 (c)(1),
(2) Date: Dec. 16, 2019

(87) PCT Pub. No.: WO2018/230154
PCT Pub. Date: Dec. 20, 2018

(65) Prior Publication Data
US 2021/0172812 A1 Jun. 10, 2021

(30) Foreign Application Priority Data

Jun. 16, 2017 (JP) .............................. JP2017-119095

(51) Int. Cl.
*G01L 1/12* (2006.01)
*H01L 41/12* (2006.01)
*H01L 41/20* (2006.01)

(52) U.S. Cl.
CPC ............ *G01L 1/125* (2013.01); *H01L 41/125* (2013.01); *H01L 41/20* (2013.01)

(58) Field of Classification Search
CPC ......... G01L 1/125; G01L 3/102; G01L 3/103; G01L 9/16
See application file for complete search history.

(56) References Cited

U.S. PATENT DOCUMENTS 5,585,574 A * 12/1996 Sugihara ................. G01L 3/102
73/862.333
6,017,402 A * 1/2000 Sukigara ................. H01L 41/20
148/301
(Continued)

FOREIGN PATENT DOCUMENTS

JP H11-014472 A 1/1999
JP 2005-345264 A 12/2005
(Continued)

OTHER PUBLICATIONS

May 20, 2019 International Preliminary Report on Patentability issued in International Patent Application No. PCT/JP2018/016247.
(Continued)

*Primary Examiner* — Herbert K Roberts
(74) *Attorney, Agent, or Firm* — Oliff PLC

(57) ABSTRACT

An energy converter is formed by bonding a solid soft magnetic material and a solid magnetostrictive material. A vibration power generator is configured to generate power by means of the inverse magnetostriction effect of the magnetostrictive material produced by the vibration of a vibration unit configured using the energy converter. A force sensor device includes a force detection unit that detects (Continued)

magnetization change resulting from the inverse magnetostriction effect of the magnetostrictive material produced when a sensor unit configured using the energy converter deforms, and determines force acting on the sensor unit on the basis of the detected magnetization change. An actuator is configured to vibrate the vibration unit configured using the energy converter by means of the magnetostriction effect of the magnetostrictive material.

17 Claims, 9 Drawing Sheets

(56) References Cited

U.S. PATENT DOCUMENTS

| | | | | |
|---|---|---|---|---|
| 6,149,736 A | * | 11/2000 | Sukigara | H01F 1/0306 148/101 |
| 2002/0078765 A1 | * | 6/2002 | Shinoura | H01L 41/47 73/862.333 |
| 2005/0001367 A1 | * | 1/2005 | Taya | H01L 41/20 267/166 |
| 2008/0100969 A1 | * | 5/2008 | Mizuno | G01R 33/093 360/314 |
| 2010/0263962 A1 | * | 10/2010 | Shimizu | B62D 6/10 180/446 |
| 2012/0128970 A1 | * | 5/2012 | Motoe | G01L 3/102 428/336 |
| 2013/0291657 A1 | * | 11/2013 | Purekar | G01L 3/101 73/862.333 |
| 2016/0282101 A1 | * | 9/2016 | Kaji | G01L 9/0042 |
| 2017/0040912 A1 | * | 2/2017 | Furukawa | H01L 41/125 |
| 2017/0093306 A1 | * | 3/2017 | Ueno | F03G 7/08 |

FOREIGN PATENT DOCUMENTS

| | | | |
|---|---|---|---|
| JP | 2008-112841 A | | 5/2008 |
| JP | 2009-159574 A | | 7/2009 |
| JP | 2009159574 A | * | 7/2009 |
| JP | 2013-170996 A | | 9/2013 |
| JP | 2013-177664 A | | 9/2013 |
| JP | 2014-107982 A | | 6/2014 |
| WO | 2015/141414 A1 | | 9/2015 |

OTHER PUBLICATIONS

Jul. 24, 2018 International Search Report issued in International Patent Application No. PCT/JP2018/016247.

Narita, Fumio. "Inverse Magnetostrictive Effect in Fe29Co71 Wire/POlymer Composites". Advanced Engineering Materials, 19, pp. 1-6, 2017.

* cited by examiner

ENERGY CONVERTER, VIBRATION POWER GENERATOR, FORCE SENSOR DEVICE, AND ACTUATOR

FIELD OF THE INVENTION

The present invention relates to an energy converter, a vibration power generator, a force sensor device, and an actuator.

DESCRIPTION OF RELATED ART

A general vibration power generator using a conventional magnetostrictive material includes a vibration member of a shape easy to vibrate such as a cantilever provided with a vibration unit to which the magnetostrictive material is affixed with an adhesive, for example. The vibration power generator is configured to generate power by means of the inverse magnetostriction effect of the magnetostrictive material produced when the magnetostrictive material vibrates together with the vibration member (see Patent Literature 1 or 2, for example).

The present inventors have developed a composite material as a strong and light-weight material having high power generation performance achieved by inverse magnetostriction effect and prepared by imbedding a wire rod made of a magnetostrictive material in a base material made of epoxy resin (see Non-Patent Literature 1, for example).

CITATION LIST

Patent Literatures

Patent Literature 1: JP-A-2013-177664
Patent Literature 2: JP-A-2014-107982

Non-Patent Literature

Non-Patent Literature 1: Fumio Narita, "Inverse Magnetostrictive Effect in Fe29Co71 Wire/Polymer Composites", Advanced Engineering Materials, January 2017, Volume 19, Issue 1, 1600586

SUMMARY OF THE INVENTION

The power generators disclosed in Patent Literatures 1 and 2 achieve increase in power generation capacity by increasing the amount of power generation or widening the range of a power generation frequency through devising of the vibration member in terms of a shape, for example. However, only doing this encounters a problem of imposing limitation on the improvement of power generation capacity. The composite material disclosed in Non-Patent Literature 1 has high power generation capacity. However, as this composite material is manufactured by pouring epoxy resin as the base material around the wire rod made of the magnetostrictive material, nonuniformity is caused in the quality of the base material to cause the probability of instable power generation characteristics.

The present invention has been made focusing on those problems. It is an object of the present invention to provide a vibration power generator capable of increasing power generation capacity and having stable power generation characteristics, an energy converter forming the vibration power generator, and a force sensor device and an actuator each including the energy converter.

To attain the above object, the energy converter according to the present invention is formed by bonding a solid soft magnetic material and a solid magnetostrictive material.

The energy converter according to the present invention is used suitably in a device such as a vibration power generator, a force sensor device, or an actuator to use conversion between energy types such as electric energy, magnetic energy, mechanical energy, etc. The energy converter according to the present invention can be manufactured by producing materials in large quantities as composite magnetostrictive materials prepared by bonding a soft magnetic material and a magnetostrictive material, and cutting out an intended part shape from the composite magnetostrictive materials, for example. The magnetostrictive material has a magnetostriction constant $\lambda$ having an absolute value of 20 ppm or more.

The vibration power generator according to the present invention includes a vibration unit configured using the energy converter according to the present invention, and is configured to generate power by means of the inverse magnetostriction effect of the magnetostrictive material produced by the vibration of the vibration unit.

When the vibration unit configured using the energy converter according to the present invention vibrates, the vibration power generator according to the present invention generates power by means of the inverse magnetostriction effect of the magnetostrictive material. Further, using magnetization change resulting from this inverse magnetostriction effect, the magnetization of the soft magnetic material can also be changed. By using the magnetization change of the soft magnetic material, the inverse magnetostriction effect achieves further increase in vibration power generation capacity than a case using only the inverse magnetostriction effect of the magnetostrictive material. Further, as the vibration unit is formed by bonding the solid soft magnetic material and the solid magnetostrictive material, nonuniformity in power generation characteristics is prevented compared to manufacture of the vibration unit using a liquid material, making it possible to achieve intended and stable power generation characteristics.

The vibration power generator according to the present invention is used suitably by being attached to a vibrator. Any type of vibrator to vibrate is applicable. For efficient power generation, however, the vibrator preferably vibrates in a direction of the vibration of the vibration unit and vibrates at a substantially constant frequency covering a natural vibration frequency of the vibration unit. As an example, the vibrator is an industrial machine such as a pump or a motor.

In the vibration power generator according to the present invention, the vibration unit may have one or more parts at which stress concentration occurs in response to vibration. In this case, change in magnetic flux density can be increased in the vicinity of the stress concentration part during the vibration, and power generation efficiency can be increased by adjusting a position of the stress concentration and the position of a power generating coil. The part of the stress concentration can be formed by changing the cross-sectional shape of the vibration unit in the direction of the length of the vibration unit, for example.

The force sensor device according to the present invention includes a sensor unit configured using the energy converter according to the present invention, and a force detection unit that detects magnetization change resulting from the inverse magnetostriction effect of the magnetostrictive material produced when the sensor unit deforms, and determines force acting on the sensor unit on the basis of the detected magnetization change.

In the force sensor device according to the present invention, when the sensor unit configured using the energy converter according to the present invention deforms in response to application of force, magnetization change resulting from the inverse magnetostriction effect of the magnetostrictive material can be detected by the force detection unit. At this time, the magnetization change resulting from the inverse magnetostriction effect also changes the magnetization of the soft magnetic material. This generates larger magnetization change than in a case using only the magnetostrictive material to achieve higher capacity of detecting force acting on the sensor unit. Further, as the sensor unit is formed by bonding the solid soft magnetic material and the solid magnetostrictive material, nonuniformity in the characteristics of magnetization Change relative to acting force is prevented compared to manufacture of the sensor unit using a liquid material, making it possible to achieve intended and stable characteristics of magnetization change.

In the force sensor device according to the present invention, the force detection unit may include a magnetic sensor arranged in the vicinity of the magnetostrictive material, and may be configured to detect the magnetization change as leakage flux using the magnetic sensor. Any type of magnetic sensor capable of detecting magnetization change as leakage flux is applicable. For example, the magnetic sensor is configured using a Hall element. The force detection unit may include a detecting coil arranged in the vicinity of the magnetostrictive material, and may be configured to detect the magnetization change as impedance change using the detecting coil. The detecting coil is a solenoid coil, for example.

In the force sensor device according to the present invention, the sensor unit may have one or more parts at which stress concentration occurs in response to application of the force. In this case, change in magnetic flux density can be increased in the vicinity of the stress concentration part during application of the force, and detection capacity can be increased by adjusting a position of the stress concentration and the position of the detecting coil, for example. The part of the stress concentration can be formed by changing the cross-sectional shape of the sensor unit in the direction of the length of the sensor unit, for example.

The actuator according to the present invention includes a vibration unit configured using the energy converter according to the present invention, and a vibrating coil arranged to vibrate the vibration unit by means of the magnetostriction effect of the magnetostrictive material in response to flow of a current. The actuator according to the present invention may have a configuration similar to that of the vibration power generator according to the present invention. Further, in the actuator according to the present invention, the vibrating coil may be wound around the vibration unit or wound around a yoke magnetically coupled to the vibration unit.

In the actuator according to the present invention, when a current flows in the vibrating coil, the magnetization of the magnetostrictive material is changed by the current. In this way, the magnetostriction effect of the magnetostrictive material can be used for vibrating the vibration unit. In this case, the magnetization behavior of the soft magnetic material and the magnetostriction phenomenon of the magnetostrictive material produce synergic effect to achieve vibration efficiency higher than that achieved by using only the magnetostrictive material. Further, as the vibration unit is formed by bonding the solid soft magnetic material and the solid magnetostrictive material, nonuniformity in vibration characteristics is prevented compared to manufacture of the vibration unit using a liquid material, making it possible to achieve intended and stable vibration characteristics.

In the energy converter according to the present invention, the magnetostrictive material is preferably made of an Fe—Co based alloy, an Fe—Al based alloy, Ni, an Ni—Fe based alloy, or an Ni—Co based alloy. In this case, the magnetostrictive material achieving high energy conversion efficiency can easily be manufactured by performing rolling process or heat treatment on an Fe—Co based alloy, an Fe—Al based alloy, Ni, an Ni—Fe based alloy, or an Ni—Co based alloy available at relatively low cost. This makes it possible to increase power generation efficiency during use in the vibration power generator, force detection capacity during use in the force sensor device, or vibration efficiency during use in the actuator. Such magnetostrictive materials have good machining properties and are processed easily by plastic working such as cutting or bending, and can be shaped easily into an arbitrary shape accordingly. An Fe content in an Ni—Fe based alloy is preferably 20% by mass of less. A Co content in an Ni—Co based alloy is preferably 30% by mass or less. To improve resistance to corrosion or durability, the magnetostrictive material may contain Cr, Ni, Nb, V, or Ti, for example.

In the energy converter according to the present invention, the soft magnetic material may be of any type. For example, the soft magnetic material may be made of pure iron, an Fe—Ni based alloy represented by a PB permalloy, silicon steel, or electromagnetic stainless steel, for example. The soft magnetic material has a coercivity of preferably 8 A/cm or less, and particularly preferably, 3 A/cm. The soft magnetic material may be made of a magnetostrictive material having a magnetostriction constant of a different sign from a magnetostriction constant of the magnetostrictive material. Regarding these materials, one of the soft magnetic material and the magnetostrictive material may be made of an Fe—Co based alloy or an Fe—Al based alloy having a positive magnetostriction constant, and the other may be made of an alloy based on Ni and 0 to 20% by mass of Fe (including pure Ni) or an Ni—Co based alloy having a negative magnetostriction constant. This makes inverse magnetostriction effect available to be produced by compressive stress and tensile stress generated simultaneously by the action of vibration or force, making it possible to increase power generation capacity further during use in the vibration power generator or force detection capacity further during use in the force sensor device. Additionally, by the magnetization change caused by a current, magnetostriction effects generated simultaneously at a positive magnetostrictive material and a negative magnetostrictive material become available to achieve higher increase in vibration capacity during use in the actuator.

In the energy converter according to the present invention, the soft magnetic material and the magnetostrictive material may be bonded by any method such as thermal diffusion bonding, hot rolling process, hot drawing process, an adhesive, welding, clad rolling, or explosive cladding, for example. In particular, if thermal diffusion bonding, hot rolling process, or hot drawing process is used for the bonding, the domain wall movement of the magnetostrictive material is facilitated using residual stress generated after the bonding at high temperature and then cooling. Thus, magnetization change is encouraged. This makes it possible to increase power generation capacity or force detection capacity further by means of inverse magnetostriction effect during use in the vibration power generator or the force sensor device, or increase vibration capacity further by means of magnetostriction effect during use in the actuator.

In the energy converter according to the present invention, the soft magnetic material and the magnetostrictive material may be bonded under application of a load. In this case, residual stress is generated after the load is removed after the bonding to facilitate the domain wall movement of the magnetostrictive material, thereby encouraging magnetization change. This makes it possible to increase power generation capacity or force detection capacity further by means of inverse magnetostrictive effect during use in the vibration power generator or the force sensor device, or increase vibration capacity further by means of magnetostriction effect during use in the actuator.

In the present invention, the soft magnetic material may be omitted and the energy converter may be formed by bonding a solid member and the solid magnetostrictive material by thermal diffusion bonding, hot rolling process, or hot drawing process. Further, the energy converter may be formed by bonding the solid member and the solid magnetostrictive material with an adhesive or by welding under application of a load. Even in these cases, the domain wall movement of the magnetostrictive material is still facilitated using residual stress to encourage magnetization change, while this effect is inferior to the effect achieved by the use of the soft magnetic material. This makes it possible to increase power generation capacity or force detection capacity by means of inverse magnetostriction effect during use in the vibration power generator or the force sensor device, or increase vibration capacity by means of magnetostriction effect during use in the actuator. The solid member may be stainless steel or wood, for example.

The present invention can provide a vibration power generator capable of increasing power generation capacity and having stable power generation characteristics, an energy converter forming the vibration power generator, and a force sensor device and an actuator each including the energy converter.

DETAILED DESCRIPTION OF THE INVENTION

Embodiments of the present invention will be described with reference to the drawings hereinafter.

[Energy Converter According to Embodiment of the Present Invention]

FIGS. 1 to 4 show an energy converter 1 according to an embodiment of the present invention.

Figure 1:
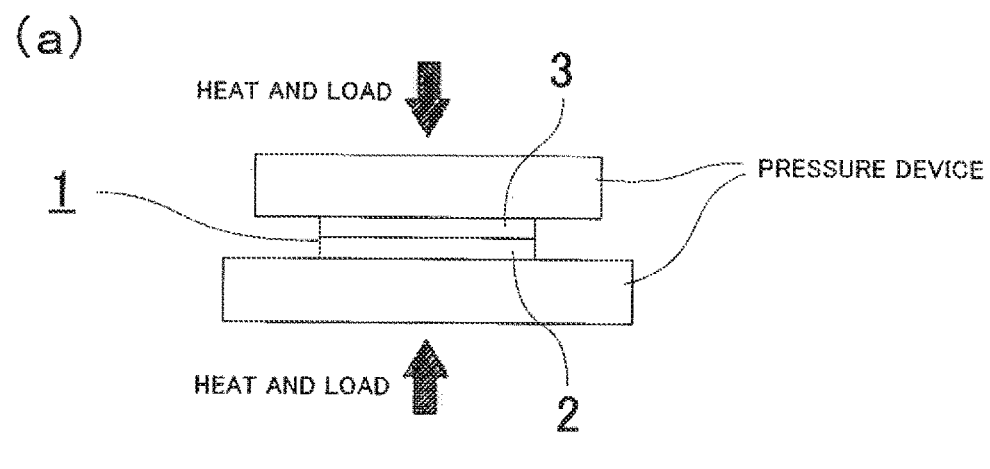
FIG. 1 is a side view showing a bonding state of an energy converter according to an embodiment of the present invention formed by (a) thermal diffusion bonding, (b) hot rolling process, and (c) welding or adhesion.
Figure 1:
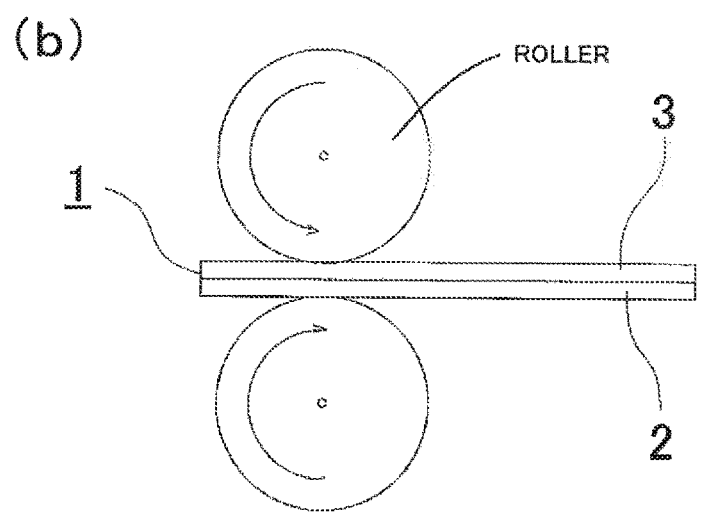
Figure 1:
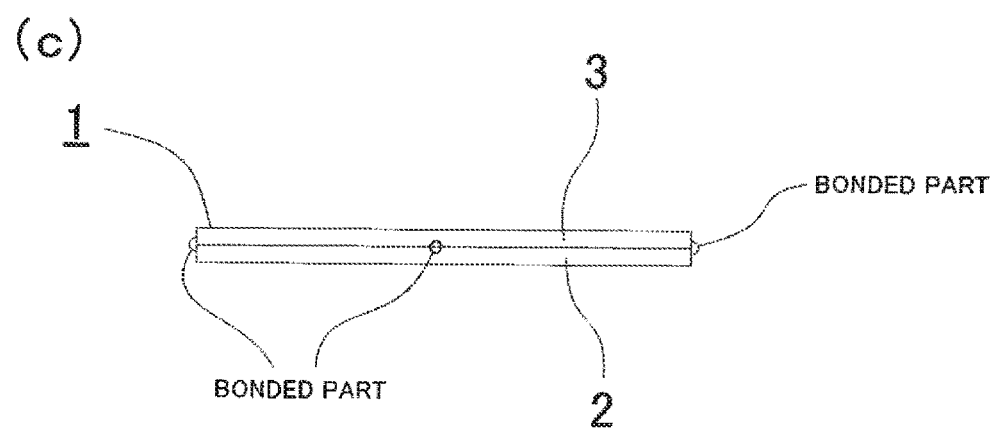

As shown in FIG. 1, the energy converter 1 includes a solid soft magnetic material 2 of an elongated plate-like shape and a solid magnetostrictive material 3 of an elongated plate-like shape having the same length and the same width. The energy converter 1 is formed into an elongated plate-like shape by fitting and bonding a surface of the soft magnetic material 2 and a surface of the magnetostrictive material 3 so as to align the respective lateral edges.

The soft magnetic material 2 is made of a magnetic material such as pure iron, for example, of a different kind from the magnetostrictive material 3. For example, the magnetostrictive material 3 is made an Fe—Co based alloy, an Fe—Al based alloy, Ni, an Ni—Fe based alloy, or an Ni—Co based alloy. If an Ni—Fe based alloy is used, an Fe content is preferably 20% by mass of less. If an Ni—Co based alloy is used, a Co content is preferably 30% by mass or less. To improve resistance to corrosion or durability, the magnetostrictive material 3 may contain Cr, Ni, Nb, V, or Ti, for example. As shown in FIG. 1(a), the energy converter 1 is formed by bonding the soft magnetic material 2 and the magnetostrictive material 3 by thermal diffusion while heat and a lead are applied using a pressure device.

The energy converter 1 is used suitably in a device such as a vibration power generator, a force sensor device, or an actuator to use conversion between energy types such as electric energy, magnetic energy, mechanical energy, etc. The energy converter 1 according to the present invention can be manufactured by producing materials in large quantities as composite magnetostrictive materials prepared by bonding the soft magnetic material 2 and the magnetostrictive material 3, and cutting out an intended part shape from the composite magnetostrictive materials, for example.

As the energy converter 1 results from thermal diffusion bonding between the soft magnetic material 2 and the magnetostrictive material 3, the domain wall movement of the magnetostrictive material 3 is facilitated using residual stress generated after cooling, thereby encouraging magnetization change. By doing so, energy conversion efficiency can be increased. The energy converter 1 can use the relatively low-cost magnetostrictive material 3 such as an Fe—Co based alloy, an Fe—Al based alloy, Ni, an Ni—Fe based alloy, or an Ni—Co based alloy, so that the energy converter 1 can easily be manufactured at low cost. Such magnetostrictive materials 3 have good machining properties and are processed easily by plastic working such as cutting or bending, and can be shaped easily into an arbitrary shape accordingly.

In the energy converter 1, the soft magnetic material 2 may be made of a magnetostrictive material having a magnetostriction constant of a different sign from a magnetostriction constant of the magnetostrictive material 3. Regarding these materials, one of the soft magnetic material 2 and the magnetostrictive material 3 may be made of an Fe—Co based alloy or an Fe—Al based alloy having a positive magnetostriction constant, and the other may be made of an alloy based on Ni and 0 to 20% by mass of Fe (including pure Ni) or an Ni—Co based alloy having a negative magnetostriction constant. This makes inverse magnetostriction effect available to be produced by compressive stress and tensile stress generated simultaneously by the action of vibration or force, making it possible to increase energy conversion efficiency.

Bonding for forming the energy converter 1 is not limited to thermal diffusion bonding but the energy converter 1 can be formed by bonding using any method such as hot rolling process using a roller shown in FIG. 1(b), welding or adhesion shown in FIG. 1(c), hot drawing process, an adhesive, clad rolling, or explosive cladding, for example. Using hot rolling process and hot drawing process for the bonding allows increase in energy conversion efficiency, like in a case of using hot diffusion bonding.

The energy converter 1 may be formed by bonding the soft magnetic material 2 and the magnetostrictive material 3 under application of a load. Also in this case, residual stress is generated after the load is removed after the bonding to facilitate the domain wall movement of the magnetostrictive material 3, thereby encouraging magnetization change. As a result, energy conversion efficiency can be increased further.

Example 1

To examine the energy conversion efficiency of the energy converter 1 formed by bonding the soft magnetic material 2 and the magnetostrictive material 3, magnetic flux density during bending of the energy converter 1 was measured. Pure Ni was used as the soft magnetic material 2, and an Fe—Co based alloy was used as the magnetostrictive material 3. The soft magnetic material 2 and the magnetostrictive material 3 were bonded by thermal diffusion (thermocompression bonding). As shown in FIG. 2(a), a specimen of the energy converter 1 has an elongated plate-like shape having a length of 70 mm, a width of 5 mm, and a thickness of 1 mm. To cause stress concentration during the bending, a specimen with a cutout (notch) having a length of 2 mm and a depth of 1 mm and formed at the center of each of opposite edges of the specimen was also prepared. The pure Ni forming the soft magnetic material 2 is the magnetostrictive material and has a negative magnetostriction constant. The Fe—Co based alloy forming the magnetostrictive material 3 has a positive magnetostriction constant.

As shown in FIG. 2(b), a three-point bending test was conducted to bend the specimen by applying a load and magnetic flux density during the bending was measured. For the three-point bending test, poles 31 were installed at an interval Ls of 16 mm so as to locate the center position of the specimen (energy converter 1) between the poles 31, and a load P was applied downward to the center position of the specimen. The load P applied to the specimen with the cutout 1a was in a range of P=0 to 25 N. The load P applied to the specimen without the cutout 1a was in a range of P=0 to 50 N. During implementation of the test, a neodymium magnet 32 of 350 mT was attached to each of opposite end portions of the specimen and a bias magnetic field $B_{0Z}$ was applied. Magnetic flux density $B_Z$ was measured in the vicinity of the center position of the specimen directly below the load P via a force detection unit (which may comprise a detecting coil and/or magnetic sensor) 33.

The test was conducted by changing the front side and the rear side of the specimen (energy converter 1). More specifically, a side opposite a side to receive the load P was defined as a tension side, and measurements were made in the case of the tension side defined by the soft magnetic material 2 and in the case of the specimen with the tension side defined the magnetostrictive material 3. A specimen using SUS304 as a nonmagnetic material instead of the soft magnetic material 2 was prepared as a comparative specimen and this specimen was subjected to the same test.

Figure 3:
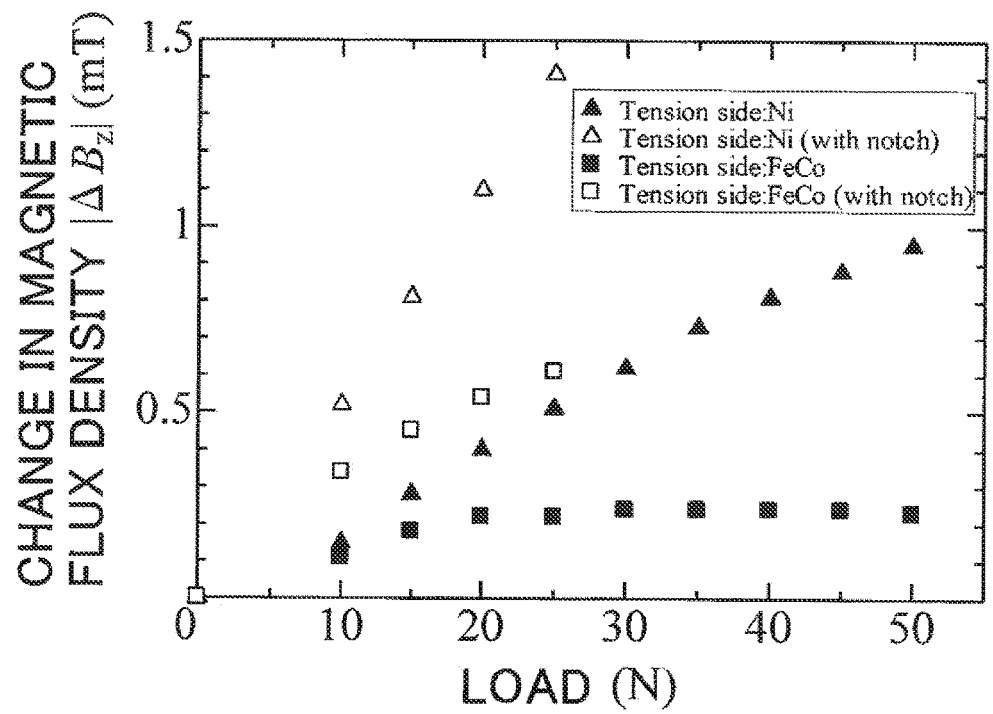
FIG. 3 is a graph of change in magnetic flux density relative to a load showing a result of the measurement test of magnetic flux density by means of the three-point bending test conducted on the specimen of the energy converter shown in FIG. 2.
Figure 4:
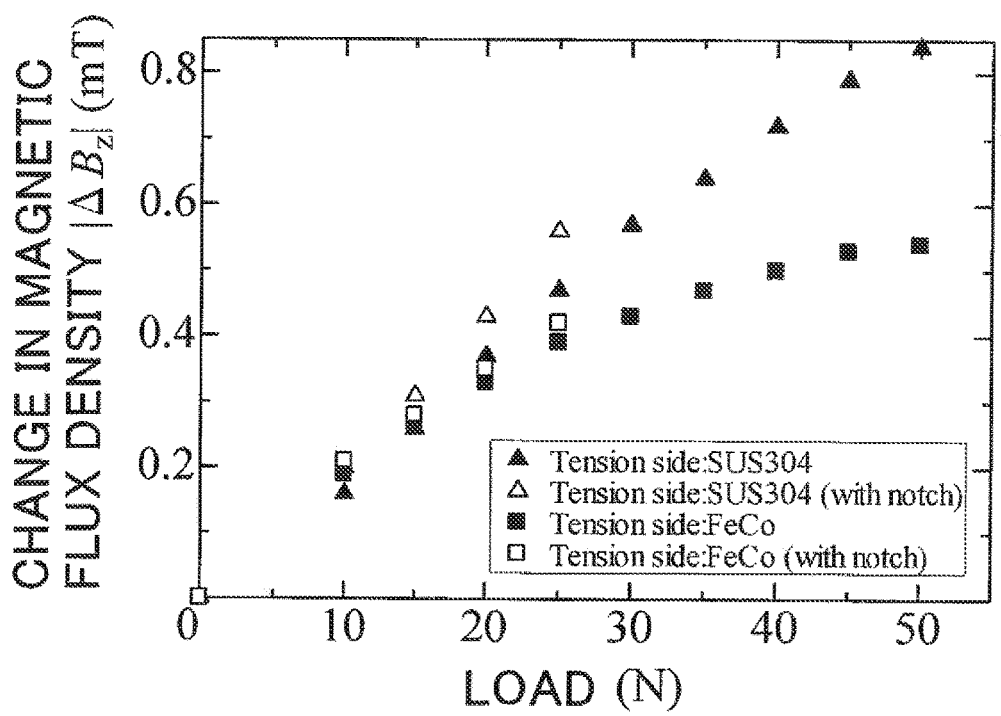
FIG. 4 is a graph of change in magnetic flux density relative to a load showing a result of the measurement test of magnetic flux density by means of the three-point bending test shown in FIG. 2 conducted on a comparative specimen.

FIG. 3 shows a test result about the specimen corresponding to the energy converter 1. FIG. 4 shows a test result about the comparative specimen. As shown in FIGS. 3 and 4, the specimen with the soft magnetic material 2 made of the pure Ni (in the case of FIG. 4, nonmagnetic material) forming the tension side and with the magnetostrictive material 3 made of the Fe—Co based alloy forming a compression side was confirmed to generate larger change in magnetic flux density relative to a load than the specimen in the opposite direction. Further, the specimen with the cutout (notch) 1a causes larger stress concentration. Thus, this specimen was also confirmed to generate larger change in magnetic flux density relative to a load than the specimen without the cutout 1a. Additionally, under the same test condition, the specimen using the soft magnetic material 2 shown in FIG. 3 was confirmed to generate larger change in magnetic flux density relative to a load than the comparative specimen using the nonmagnetic material Shown in FIG. 4.

[Force Sensor Device According to Embodiment of the Present Invention]

As described above, force acting on the energy converter 1 can be detected as change in magnetic flux density, making it possible to form a force sensor device using the energy converter 1. As an example, such a force sensor device may include a sensor unit configured using the energy converter 1, and a force detection unit that detects magnetization change resulting from the inverse magnetostriction effect of the magnetostrictive material 3 produced when the sensor unit deforms, and determines force acting on the sensor unit on the basis of the detected magnetization change The force detection unit may be configured to detect the magnetization change as leakage flux using a Hall element arranged in the vicinity of the magnetostrictive material 3, or may be configured to detect the magnetization change as impedance change using a solenoid coil arranged in the vicinity of the magnetostrictive material 3.

In the foregoing force sensor device, magnetization is changed not only by the inverse magnetostriction effect of the magnetostrictive material 3 of the sensor unit but this magnetization change also changes the magnetization of the soft magnetic material 2. This generates larger magnetization change than in a case using only the magnetostrictive material 3 to achieve higher capacity of detecting force acting on the sensor unit. Further, as the sensor unit is formed by bonding the solid soft magnetic material 2 and the solid magnetostrictive material 3, nonuniformity in the characteristics of magnetization change relative to acting force is prevented compared to manufacture of the sensor unit using a liquid material, making it possible to achieve intended and stable characteristics of magnetization change.

Figure 2:
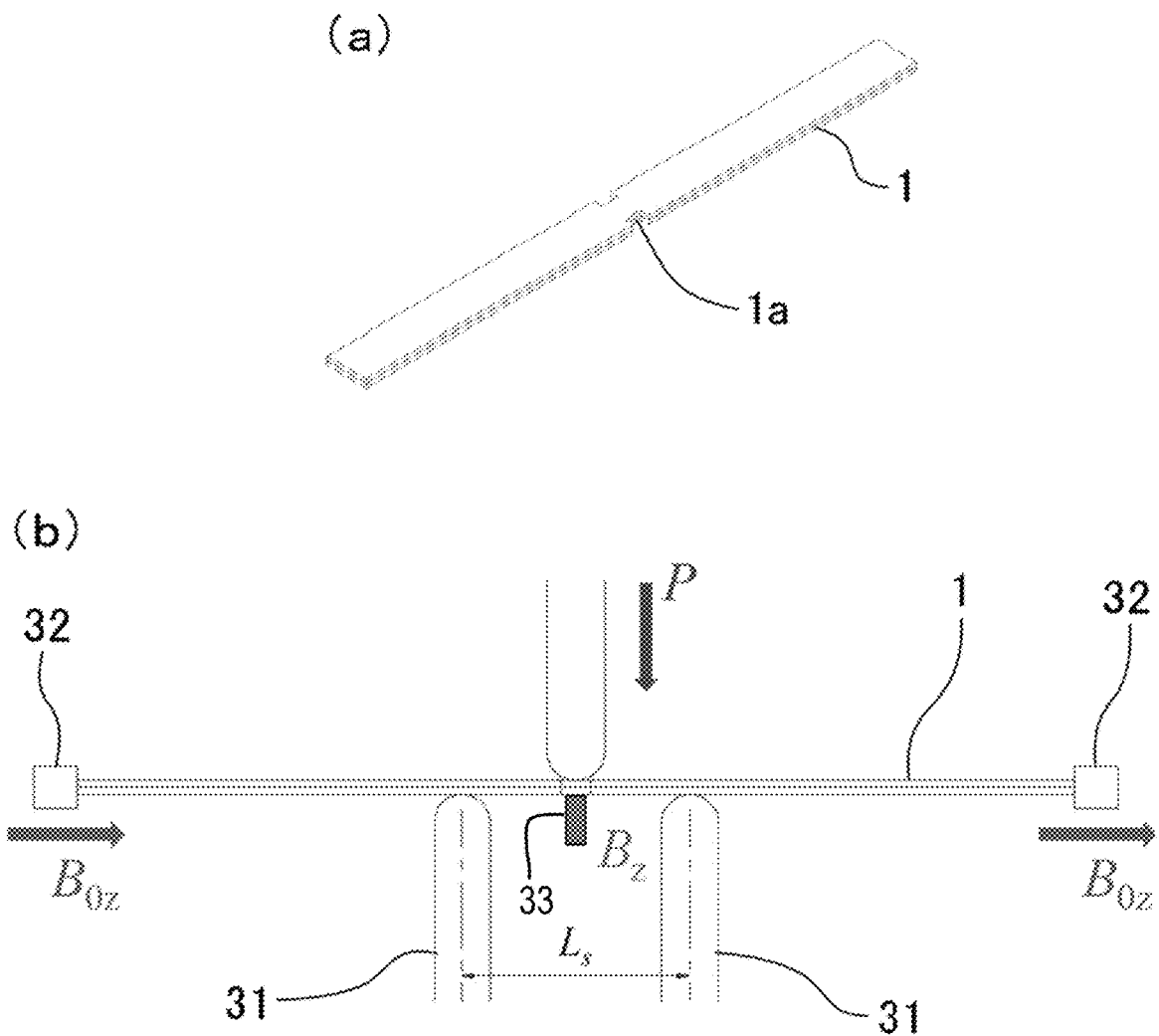
FIG. 2 includes (a) a perspective view of a specimen of the energy converter according to the embodiment of the present invention used in a three-point bending test acid (b) a side view showing how a measurement test of magnetic flux density is conducted by means of the three-point bending test.

To increase change in magnetic flux density generated during application of force, the force sensor device may include the cutout 1a as a stress concentration part, as shown in FIG. 2, for example. In this case, detection capacity can be increased by adjusting a position of stress concentration and the position of a detecting coil, for example.

[Vibration Power Generator of Embodiment of the Present Invention]

FIGS. 5 to 12 show a vibration power generator 10 according to the embodiment of the present invention.

Figure 5:
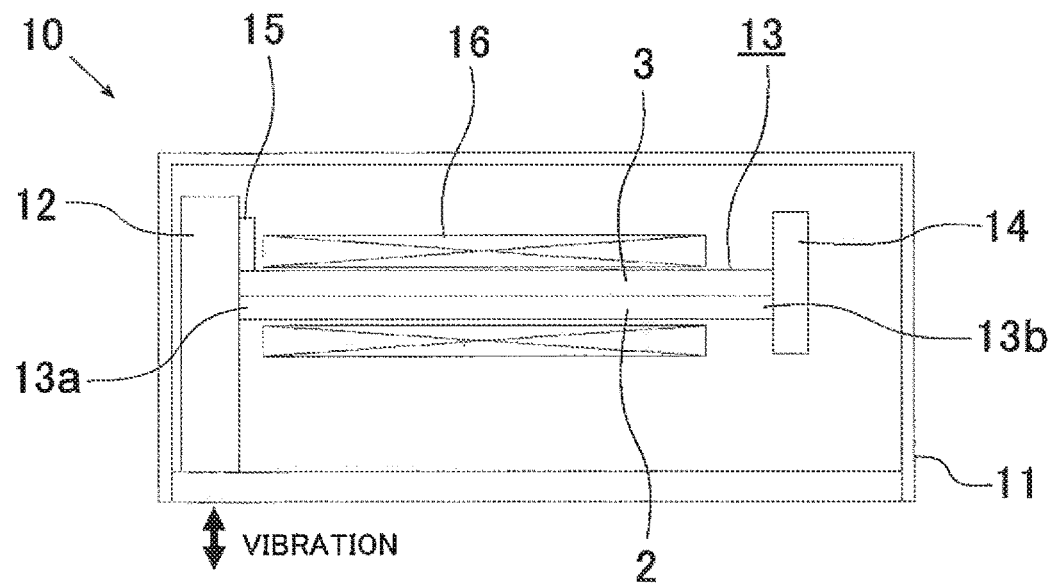
FIG. 5 is a side view showing a vibration power generator according to the embodiment of the present invention.

As shown in FIG. 5, the vibration power generator 10 includes a casing 11, a support 12, a vibration unit 13, a weight 14, a magnet 15, and a power generating coil 16.

The casing 11 is formed of an elongated box like a rectangular parallelepiped and has internal housing space. The support 12 is made of a thick plate material and fixed to one end of the interior of the casing 11. The support 12 is fixed while one surface of the support 12 is pointed toward the other end of the casing 11.

The vibration unit 13 is configured using the energy converter 1 shown in FIG. 1. The vibration unit 13 has one end portion 13a fixed to the one surface of the support 12 in such a manner that the vibration unit 13 extends inside the casing 11 from the one surface of the support 12 toward the other end of the casing 11. The vibration unit 13 is formed into a cantilever supported on the support 12 and is configured to vibrate in a direction perpendicular to a length direction.

The weight 14 is attached to an end portion 13b of the vibration unit 13 on the other side, namely, to the tip of the cantilever. The magnet 15 is attached to the one end portion 13a of the vibration unit 13 and the support 12 at a position of attachment of the vibration unit 13 to the support 12. The magnet 15 is attached so as to contact the magnetostrictive material 3 in a manner allowing application of a bias magnetic field to the magnetostrictive material 3. The power generating coil 16 is arranged to pass the vibration unit 13 through inside the power generating coil 16 and located at the center and its vicinity of the vibration unit 13.

The vibration power generator 10 is provided to be installable on a vibrator at the easing 11 and configured to vibrate at the other end portion 13b of the vibration unit 13 in response to the vibration of the vibrator. In this way, the vibration power generator 10 generates power by means of the inverse magnetostriction effect of the magnetostrictive Material 3 produced by the vibration of the vibration unit 13. The vibration power generator 10 may be configured to apply vibration forcibly to the vicinity of the other end portion 13b of the vibration unit 13, for example.

Effects will be described next.

For using the vibration power generator 10, the vibration power generator 10 is installed at the casing 11 on a vibrator such as an industrial machine like a pump or a motor. When the vibration unit 13 vibrates in a direction perpendicular to the direction of the length of the vibration unit 13 in response to the vibration of the vibrator, the vibration power generator 10 generates power by means of the inverse magnetostriction effect of the magnetostrictive material 3. Further, using magnetization change resulting from this inverse magnetostriction effect, magnetization can also be changed inside the soft magnetic material 2 or around the soft magnetic material 2. By using the magnetization change of the soft magnetic material 2, the inverse magnetostriction effect achieves further increase in vibration power generation capacity than a case using only the inverse magnetostriction effect of the magnetostrictive material 3. Further, as the vibration unit 13 is formed by bonding the solid soft magnetic material 2 and the solid magnetostrictive material 3, nonuniformity in power generation characteristics is prevented compared to manufacture of the vibration unit 13 using a liquid material, making it possible to achieve intended and stable power generation characteristics.

In the vibration power generator 10, the vibration unit 13 may have one or more parts such as the cutout 1a shown in FIG. 2(a) at which stress concentration occurs in response to vibration. In this case, change in magnetic flux density can be increased in the vicinity of the stress concentration part during the vibration, and power generation efficiency can be increased by adjusting a position of the stress concentration and the position of the power generating coil 16. The part of the stress concentration can be formed by changing the cross-sectional shape of the vibration unit 13 in the direction of the length of the vibration Unit 13, for example. In the vibration power generator 10, the weight 14 may be omitted and the vibration unit 13 may have a double supported beam shape (double-end beam, double-end fixed beam or double-end supported beam) in which the other end portion 13b is also fixed.

Example 2

An experiment of measuring the amount of power generation relative to the vibration of a vibrator was conducted on the vibration power generator 10 shown in FIG. 5 using the vibration unit 13 in which pure iron (coercivity of 0.8 A/cm) was used as the soft magnetic material 2 and an alloy based on Fe and 70% by mass of Co having a positive magnetostriction constant was used as the magnetostrictive material 3. For the experiment, the length, width, and thickness of the vibration unit 13 are adjusted at 70 mm, 6 mm, and 1 mm respectively, and a resonant frequency is adjusted at about 50 Hz. The vibration unit 13 is formed by bonding the soft magnetic material 2 and the magnetostrictive material 3 by thermal diffusion bonding.

Figure 6:
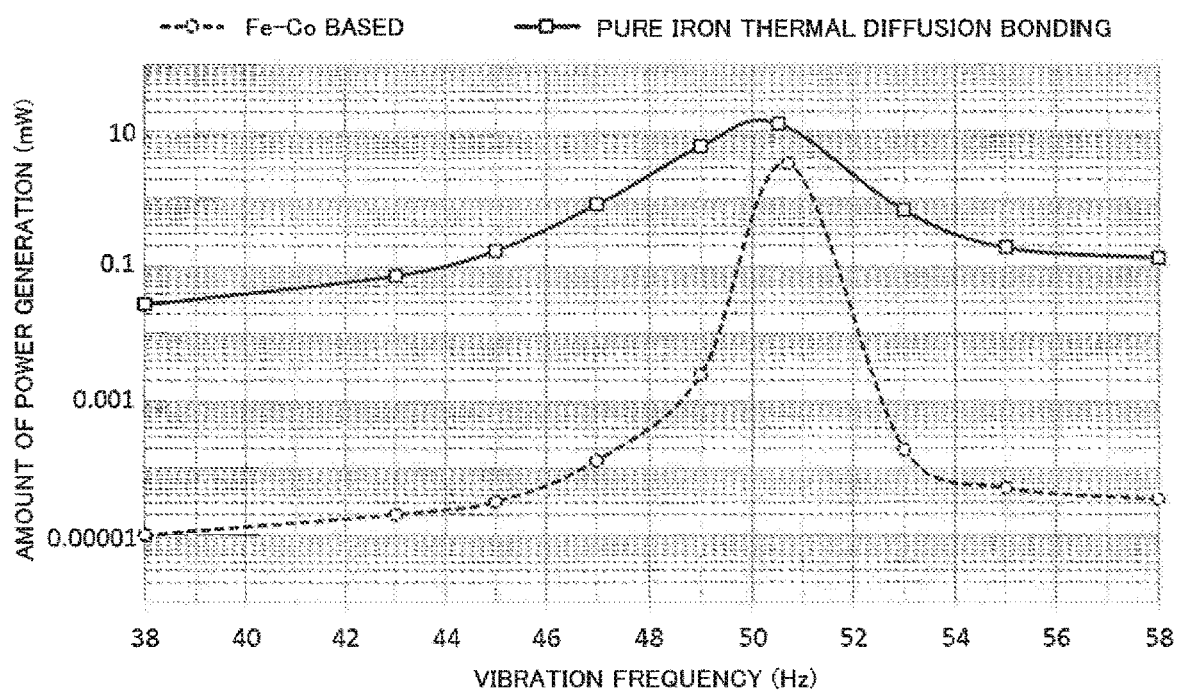
FIG. 6 includes graphs showing measurement results about the amounts of power generation relative to a vibration frequency about a vibration unit prepared by thermal diffusion bonding between pure iron and an alloy based on Fe and 70% by mass of Co, and a vibration unit made only of an alloy based on Fe and 70% by mass of Co in the vibration power generator shown in FIG. 5.

FIG. 6 shows a measurement result about the amount of power generation determined by changing the vibration frequency of the vibrator. For comparison, FIG. 6 further shows a result about the vibration unit 13 formed by using only the magnetostrictive material 3 made of an alloy based on Fe and 70% by mass of Co. As shown in FIG. 6, bonding the pure iron forming the soft magnetic material 2 and the magnetostrictive material 3 ("pure iron thermal diffusion bonding" in FIG. 6) was confirmed to produce a larger amount of power generation at every vibration frequency than using only the magnetostrictive material 3 ("Fe—Co based" in FIG. 6). Bonding the pure iron forming the soft magnetic material 2 and the magnetostrictive material 3 was also confirmed to reduce change in the amount of power generation between before and after the resonant frequency compared to using only the magnetostrictive material 3. These results show that bonding the soft magnetic material 2 and the magnetostrictive material 3 having a positive magnetostriction constant achieves improvement in power generation capacity.

Example 3

An experiment of Measuring the amount of power generation relative to the vibration of a vibrator was conducted on the vibration power generator 10 shown in FIG. 5 using the vibration unit 13 in which pure iron (coercivity of 0.8 A/cm) was used as the soft magnetic material 2, and each of pure Ni having a negative magnetostriction constant and an alloy based on Ni and 10% by mass of Fe having a negative magnetostriction constant was used as the magnetostrictive material 3. For the experiment, the length, width, and thickness of the vibration unit 13 are adjusted at 70 mm, 6 mm, and 1 mm respectively, and a resonant frequency is adjusted at about 50 Hz. The vibration unit 13 is formed by bonding the soft magnetic material 2 and the magnetostrictive material 3 by thermal diffusion bonding.

Figure 7:
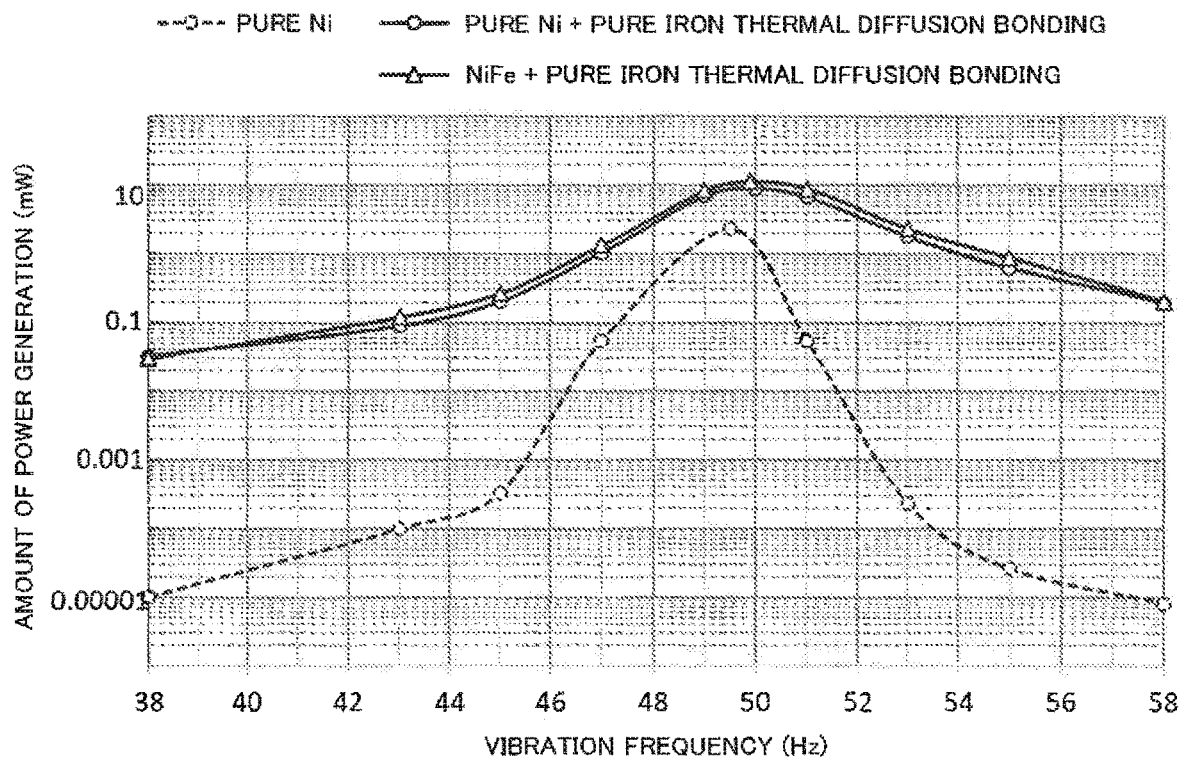
FIG. 7 includes graphs showing measurement results about the amounts of power generation relative to a vibration frequency about a vibration unit prepared by thermal diffusion bonding between pure iron and pure Ni, a vibration unit prepared by thermal diffusion bonding between pure iron and an alloy based on Ni and 10% by mass of Fe, and a vibration unit made only of pure Ni in the vibration power generator shown in FIG. 5.

FIG. 7 shows a measurement result about the amount of power generation determined by changing the vibration frequency of the vibrator. For comparison, FIG. 7 further shows a result about the vibration unit 13 formed by using only the magnetostrictive material 3 made of pure Ni. As shown in FIG. 7, bonding the pure iron forming the soft magnetic material 2 and the magnetostrictive material 3 ("Ni pure iron thermal diffusion bonding" and "NiFe+ pure iron thermal diffusion bonding" in FIG. 7) was confirmed to produce a larger amount of power generation at every vibration frequency than using only the magnetostrictive material 3 ("Ni" in FIG. 7). Bonding the pure iron forming the soft magnetic material 2 and the magnetostrictive material 3 was also confirmed to reduce change in the amount of power generation between before and after the resonant frequency compared to using only the magnetostrictive material 3. Further, using the pure Ni ("Ni+ pure iron thermal diffusion bonding" in FIG. 7) and using the alloy based on Ni and 10% by mass of Fe ("NiFe+ pure iron thermal diffusion bonding" in FIG. 7) as the magnetostrictive material 3 were confirmed to produce the amounts of power generation substantially equal to each other at every vibration frequency. These results show that bonding the soft magnetic material 2 and the magnetostrictive material 3 having a negative magnetostriction constant also achieves improvement in power generation capacity.

Example 4

An experiment of measuring the amount of power generation relative to the vibration of a vibrator was conducted on the vibration power generator 10 shown in FIG. 5 using the vibration unit 13 in which pure iron was used as the soft magnetic material 2 and an alloy based on Ni and 20% by mass of Co having a negative magnetostriction constant was used as the magnetostrictive material 3. For the experiment, the length, width, and thickness of the vibration unit 13 are adjusted at 70 mm, 6 mm, and 1 mm respectively, and a resonant frequency is adjusted at about 50 Hz. The vibration unit 13 is formed by bonding the soft magnetic material 2 and the magnetostrictive material 3 by thermal diffusion bonding.

Figure 8:
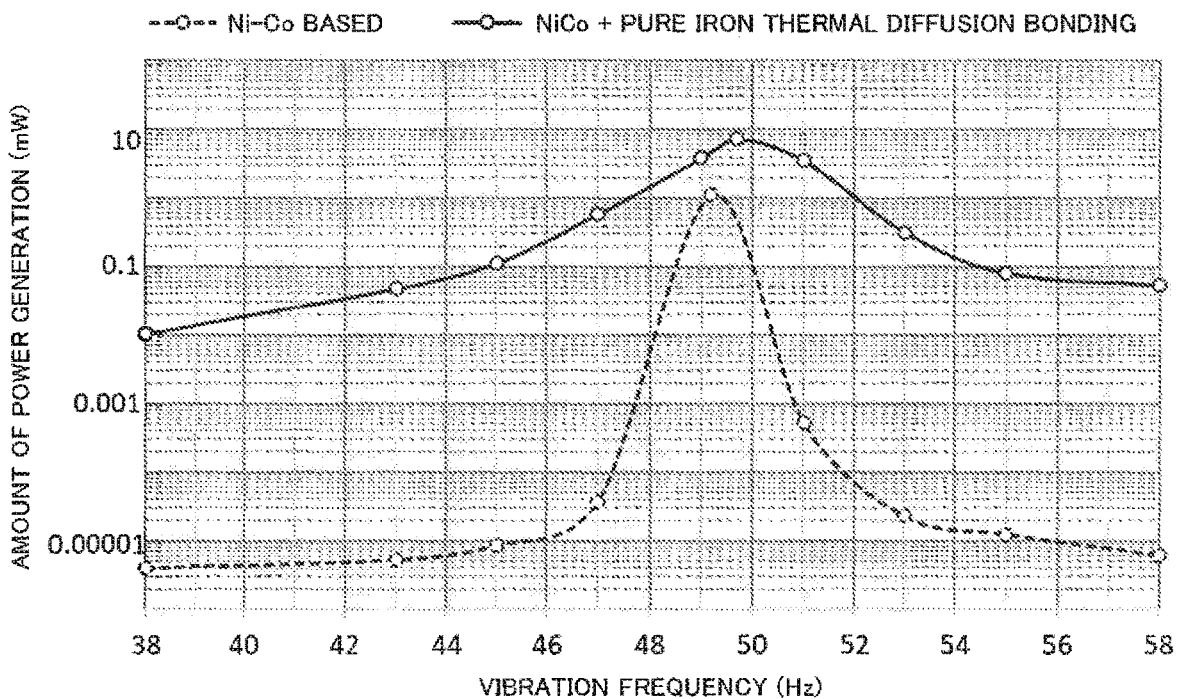
FIG. 8 includes graphs showing measurement results about the amounts of power generation relative to a vibration frequency about a vibration unit prepared by thermal diffusion bonding between pure iron and an alloy based on Ni and 20% by mass of Co, and a vibration unit made only of an alloy based on Ni and 20% by mass of Co in the vibration power generator shown in FIG. 5.

FIG. 8 shows a measurement result about the amount of power generation determined by changing the vibration frequency of the vibrator. For comparison, FIG. 8 further shows a result about the vibration unit 13 formed by using only the magnetostrictive material 3 made of an alloy based on Ni and 20% by mass of Co. As shown in FIG. 8, bonding the pure iron forming the soft magnetic material 2 and the magnetostrictive material 3 ("NiCo+ pure iron thermal diffusion bonding" in FIG. 8) was confirmed to produce a larger amount of power generation at every vibration frequency than using only the magnetostrictive material 3 ("Ni—Co based" in FIG. 8). Bonding the pure iron forming the soft magnetic material 2 and the magnetostrictive material 3 was also confirmed to reduce change in the amount of power generation between before and after the resonant frequency compared to using only the magnetostrictive material 3. These results also show that bonding the soft magnetic material 2 and the magnetostrictive material 3 having a negative magnetostriction constant achieves improvement in power generation capacity.

Example 5

An experiment of measuring the amount of power generation relative to the vibration of a vibrator was conducted on the vibration power generator 10 shown in 5 using the vibration unit 13 in which pure Ni having a negative magnetostriction constant (coercivity of 0.5 A/cm) was used as the soft magnetic material 2 and an alloy based on Fe and 70% by mass of Co having a positive magnetostriction constant was used as the magnetostrictive material 3. Two types of vibration units 13 were prepared: one formed by bonding the soft magnetic material 2 and the magnetostrictive material 3 by thermal diffusion bonding, and the other formed by adhesively bonding the soft magnetic material 2 and the magnetostrictive material 3. For the experiment, the length, width, and thickness of the vibration unit 13 are adjusted at 70 mm, 6 mm, and 1 mm respectively, and a resonant frequency is adjusted at about 50 Hz.

Figure 9:
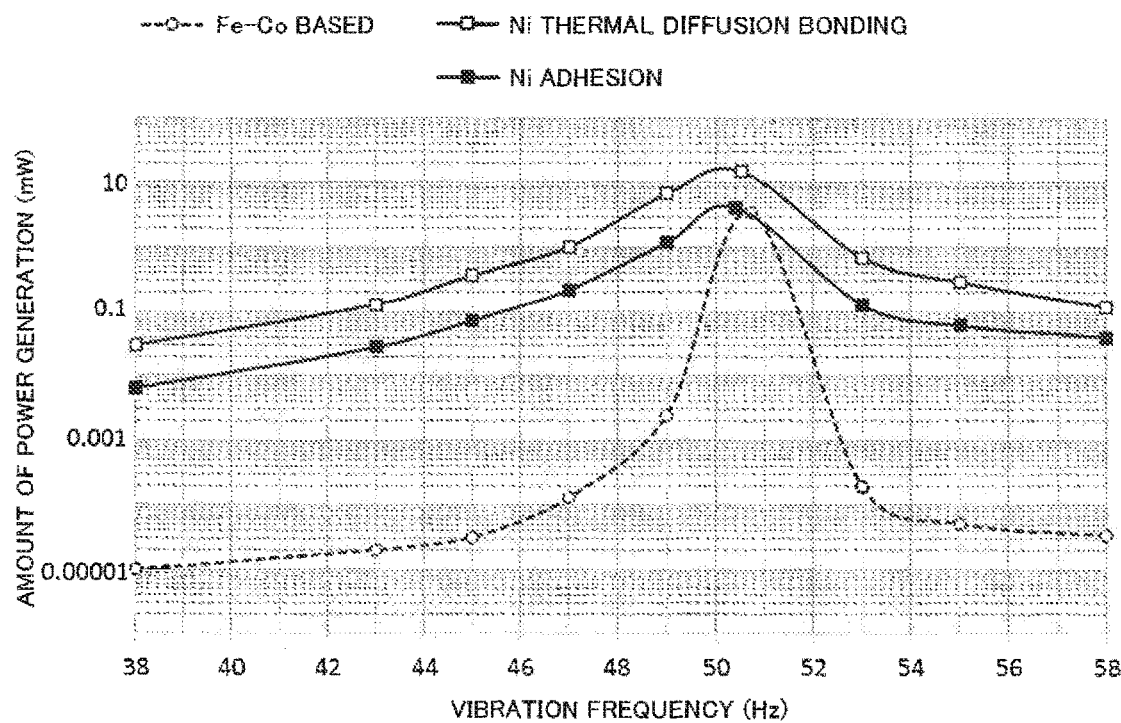
FIG. 9 includes graphs showing measurement results about the amounts of power generation relative to a vibration frequency about a vibration unit prepared by thermal diffusion bonding between pure Ni and an alloy based on Fe and 70% by mass of Co, a vibration unit prepared by adhesive bonding between pure Ni and an alloy based on Fe and 70% by mass of Co, and a vibration unit made only of an alloy based on Fe and 70% by mass of Co in the vibration power generator shown in FIG. 5.

FIG. 9 shows a measurement result about the amount of power generation determined by changing the vibration frequency of the vibrator. For comparison, FIG. 9 further shows a result about the vibration unit 13 formed by using only the magnetostrictive material 3 made of an alloy based on Fe and 70% by mass of Co. As shown in FIG. 9, bonding the pure Ni forming the soft magnetic material 2 and the magnetostrictive material 3 by thermal diffusion ("Ni thermal diffusion bonding" in FIG. 9) was confirmed to produce a larger amount of power generation at every vibration frequency than the adhesive bonding ("Ni adhesion" in FIG. 9) and than using only the magnetostrictive material 3 ("Fe—Co based" in FIG. 9). Further, using the adhesive bonding was confirmed to produce a larger amount of power generation at vibration frequencies other than the resonant frequency and neighboring frequencies than using only the magnetostrictive material 3. Still further, bonding the pure Ni forming the soft magnetic material 2 and the magnetostrictive material 3 was confirmed to reduce change in the amount of power generation between before and after the resonant frequency compared to using only the magnetostrictive material 3.

These results show that bonding the soft magnetic material 2 of the magnetostrictive material having a negative magnetostriction constant and the magnetostrictive material 3 having a positive magnetostriction constant achieves improvement in power generation capacity. Additionally, bonding the soft magnetic material 2 and the magnetostrictive material 3 by thermal diffusion is found to achieve further improvement in power generation capacity by means of residual stress generated after cooling than the adhesive bonding.

As understood from comparisons between the thermal diffusion bonding between the pure Ni forming the soft magnetic material 2 and the magnetostrictive material 3 ("Ni thermal diffusion bonding" in FIG. 9), the thermal diffusion bonding between the pure iron forming the soft magnetic material 2 and the magnetostrictive material 3 ("pure iron thermal diffusion bonding" in FIG. 6, "Ni+ pure iron thermal diffusion bonding" and "NiFe+ pure iron thermal diffusion bonding" in FIG. 7, and "NiCo+ pure iron thermal diffusion bonding" in FIG. 8), bonding the pure Ni forming the soft magnetic material 2 and the magnetostrictive material 3 by thermal diffusion produces a slightly larger amount of power generation. This is considered to be for the reason that bonding the magnetostrictive material 3 having a magnetostriction constant of a different sign makes inverse magnetostriction effect available to be produced by compressive stress and tensile stress generated simultaneously in response to vibration.

Example 6

An experiment of measuring the amount of power generation relative to the vibration of a vibrator was conducted on the vibration power generator 10 shown in FIG. 5 using the vibration unit 13 in which pure Ni having a negative magnetostriction constant was used as the soft magnetic material 2 and an alloy based on Fe and 8% by mass of Al having a positive magnetostriction constant was used as the magnetostrictive material 3. For the experiment, the length, width, and thickness of the vibration unit 13 are adjusted at 70 mm, 6 mm, and 1 mm respectively, and a resonant frequency is adjusted at about 50 Hz. The vibration unit 13 is formed by bonding the soft magnetic material 2 and the magnetostrictive material 3 by thermal diffusion bonding.

Figure 10:
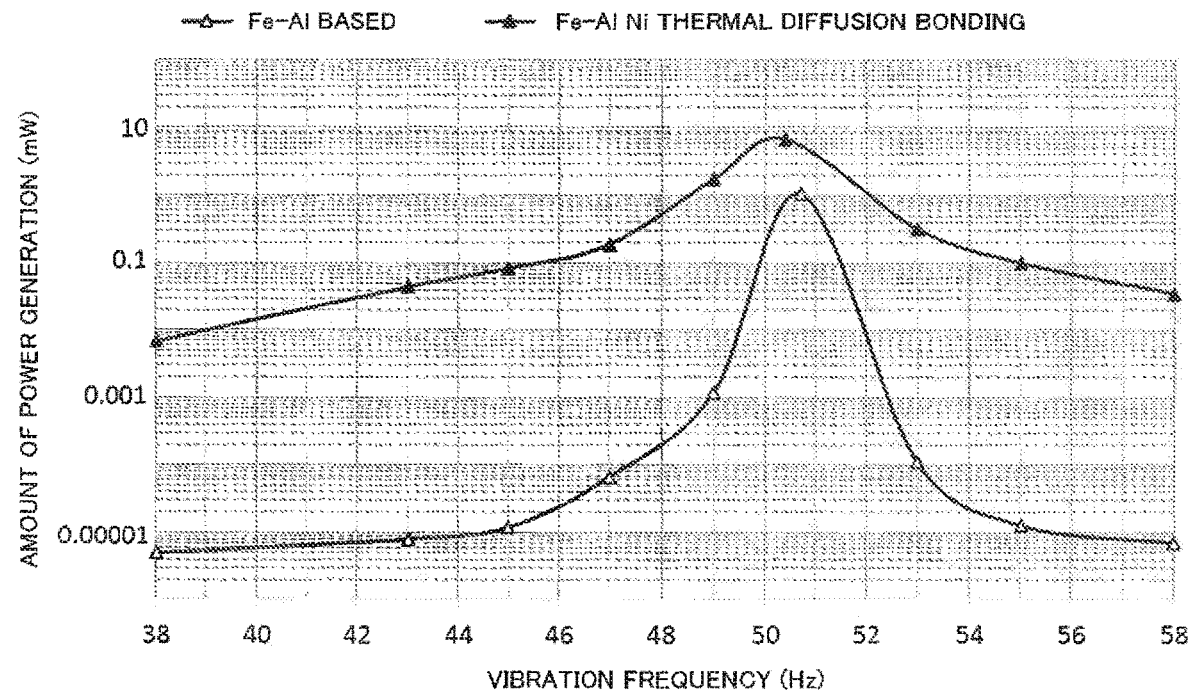
FIG. 10 includes graphs showing measurement results about the amounts of power generation relative to a vibration frequency about a vibration unit prepared by thermal diffusion bonding between pure Ni and an alloy based on Fe and 8% by mass of Al, and a vibration unit made only of an alloy based on Fe and 3% by mass of Al in the vibration power generator shown in FIG. 5.

FIG. 10 shows a measurement result about the amount of power generation determined by changing the vibration frequency of the vibrator. For comparison, FIG. 10 further shows a result about the vibration unit 13 formed by using only the magnetostrictive material 3 made of an alloy based on Fe and 8% by mass of Al. As shown in FIG. 10, bonding the pure Ni forming the soft magnetic material 2 and the magnetostrictive material 3 ("Fe—Al Ni thermal diffusion bonding" in FIG. 10) was confirmed to produce a larger amount of power generation at every vibration frequency than using only the magnetostrictive material 3 ("Fe—Al based" in FIG. 10). Bonding the pure Ni forming the soft magnetic material 2 and the magnetostrictive material 3 was also confirmed to reduce change in the amount of power generation between before and after the resonant frequency compared to using only the magnetostrictive material 3. These results show that, even by the use of the Fe—Al based alloy as the magnetostrictive material 3, bonding the soft magnetic material 2 and the magnetostrictive material 3 still achieves improvement in power generation capacity, while the improvement is slightly inferior to the improvement achieved by the use of the Fe—Co based alloy shown in FIG. 9.

Example 7

An experiment of measuring the amount of power generation relative to the vibration of a vibrator was conducted on the vibration power generator 10 shown in FIG. 5 using the vibration unit 13 in which an alloy based on Ni and 20% by mass of Co having a negative magnetostrictive constant (coercivity of 1 A/cm) was used as the soft magnetic material 2 and an alloy based on Fe and 70% by mass of Co having a positive magnetostriction constant was used as the magnetostrictive material 3. For the experiment, the length, width, and thickness of the vibration unit 13 are adjusted at 70 mm, 6 mm, and 1 mm respectively, and a resonant frequency is adjusted at about 50 Hz. The vibration unit 13 is formed by bonding the soft magnetic material 2 and the magnetostrictive material 3 by thermal diffusion bonding.

Figure 11:
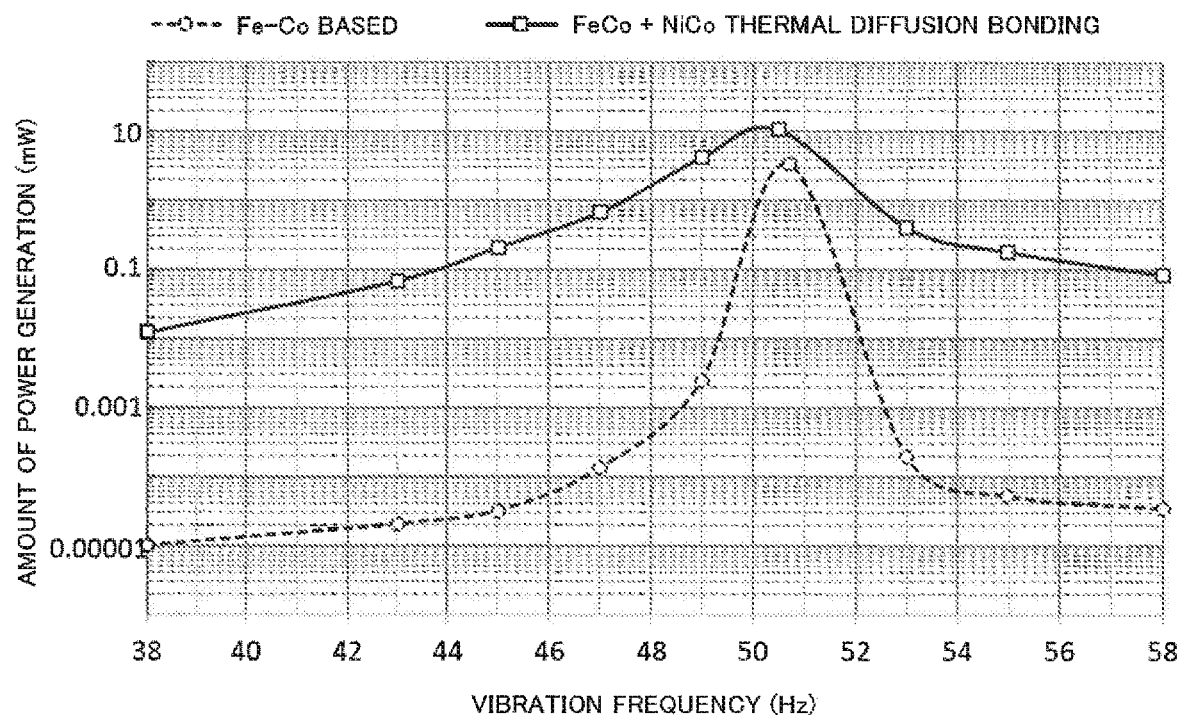
FIG. 11 includes graphs showing measurement results about the amounts of power generation relative to a vibration frequency about a vibration unit prepared by thermal diffusion bonding between an alloy based on Ni and 20% by mass of Co and an alloy based on Fe and 70% by mass of Co, and a vibration unit made only of an alloy based on Fe and 70% by mass of Co in the vibration power generator shown in FIG. 5.

FIG. 11 shows a measurement result about the amount of power generation determined by changing the vibration frequency of the vibrator. For comparison, FIG. 11 further shows a result about the vibration unit 13 formed by using only the magnetostrictive material 3 made of an alloy based on Fe and 70% by mass of Co. As shown in FIG. 11, bonding the soft magnetic material 2 and the magnetostrictive material 3 ("FeCo+NiCo thermal diffusion bonding" in FIG. 11) was confirmed to produce a larger amount of power generation at every vibration frequency than using only the magnetostrictive material 3 ("Fe—Co based" in FIG. 11). Bonding the soft magnetic material 2 and the magnetostrictive material 3 was also confirmed to reduce change in the amount of power generation between before and after the resonant frequency compared to using only the magnetostrictive material 3. These results show that, even by the use of the alloy based on Ni and 20% by mass of Co as the soft magnetic material 2, bonding the soil magnetic material 2 and the magnetostrictive material 3 still achieves improvement in power generation capacity, while the improvement is slightly inferior to the improvement achieved by the use of the pure Ni shown in FIG. 9.

[Reference Example]

An experiment of measuring the amount of power generation relative to the vibration of a vibrator was conducted on the vibration power generator 10 shown in FIG. 5 using the vibration unit 13 in which SUS304 as a nonmagnetic material was used instead of the soft magnetic material 2 and an alloy based on Fe and 70% by mass of Co was used as the magnetostrictive material 3. Two types of vibration units 13 were prepared: one formed by bonding the nonmagnetic material and the magnetostrictive material 3 by thermal diffusion bonding, and the other formed by adhesively bonding the nonmagnetic material and the magnetostrictive material 3. For the experiment, the length, width, and thickness of the vibration unit 13 are adjusted at 70 mm, 6 mm, and 1 mm respectively, and a resonant frequency is adjusted at about 50 Hz.

Figure 12:
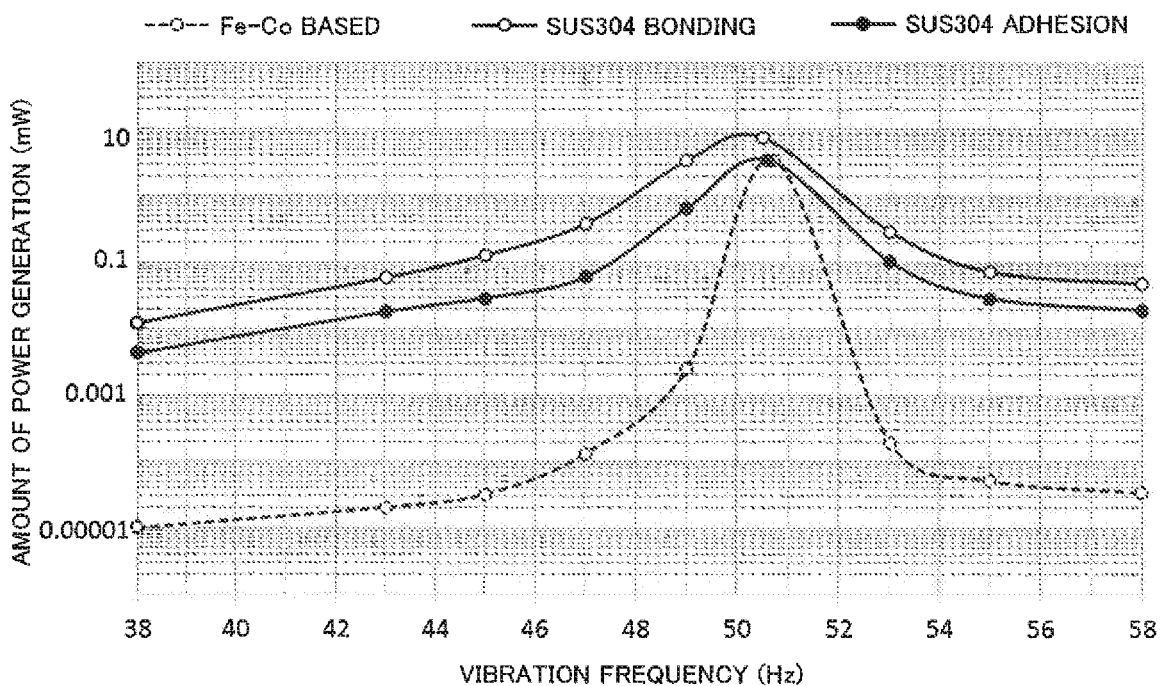
FIG. 12 includes graphs showing measurement results about the amounts of power generation relative to a vibration frequency about a vibration unit prepared by thermal diffusion bonding between SUS304 and an alloy based on Fe and 70% by mass of Co, a vibration unit prepared by adhesive bonding between SUS304 and an alloy based on Fe and 70% by mass of Co, and a vibration unit made only of an alloy based on Fe and 70% by mass of Co in the vibration power generator shown in FIG. 5.

FIG. 12 shows a measurement result about the amount of power generation determined by changing the vibration frequency of the vibrator. For comparison, FIG. 12 further shows a result about the vibration unit 13 formed by using only the magnetostrictive material 3 made of an alloy based on Fe and 70% by mass of Co. As shown in FIG. 12, bonding the SUS304 as the nonmagnetic material and the magnetostrictive material 3 by thermal diffusion ("SUS304 bonding" in FIG. 12) was confirmed to produce a larger amount of power generation at every vibration frequency than the adhesive bonding ("SUS304 adhesion" in FIG. 12) and than using only the magnetostrictive material 3 ("Fe—Co based" in FIG. 12). Further, using the adhesive bonding was confirmed to produce a larger amount of power generation at vibration frequencies other than the resonant frequency and neighboring frequencies than using only the magnetostrictive material 3. Still further, bonding the SUS304 as the nonmagnetic material and the magnetostrictive material 3 was confirmed to reduce change in the amount of power generation between before and after the resonant frequency compared to using only the magnetostrictive material 3.

These results show that even bonding the nonmagnetic material and the magnetostrictive material 3 still achieves improvement in power generation capacity, while the improvement is slightly inferior to the improvement achieved by the use of the soft magnetic material 2. Additionally, bonding the nonmagnetic material and the magnetostrictive material 3 by thermal diffusion is found to achieve further improvement in power generation capacity by means of residual stress generated after cooling than the adhesive bonding.

[Actuator According to Embodiment of the Present Invention]

Figure 13:
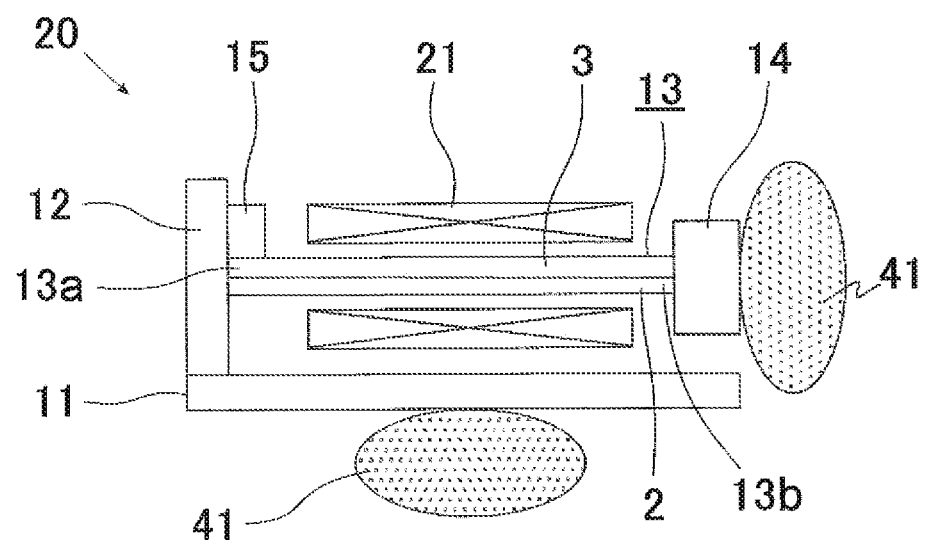
FIG. 13 is a side view showing an actuator according to the embodiment of the present invention.
Figure 14:
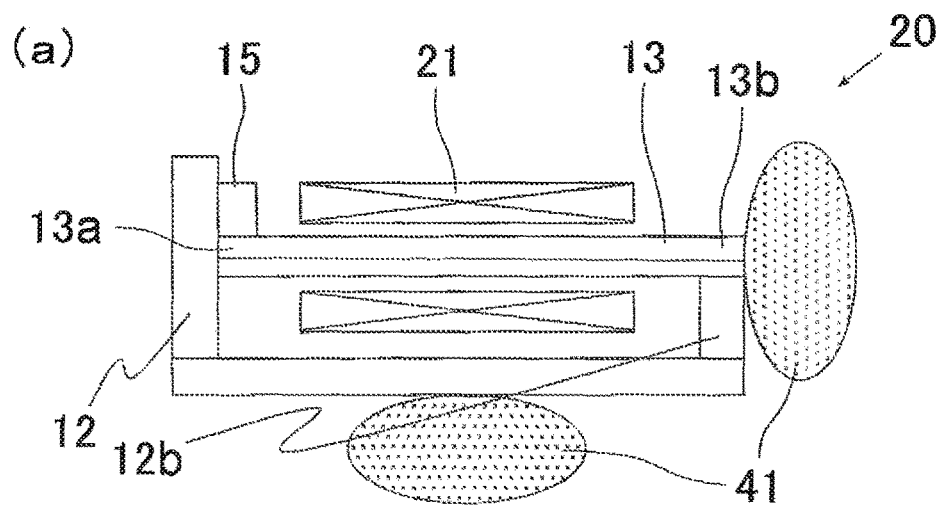
FIG. 14 includes (a) a side view showing a modification of the actuator according to the embodiment of the present invention in which a vibration unit has a double supported beam shape, (b) a side view showing a modification of the actuator in which a vibrating coil is wound around a yoke, and (c) a side view showing a modification of the actuator composed only of the vibration unit and contacting an electromagnetic field fluctuating member.
Figure 14:
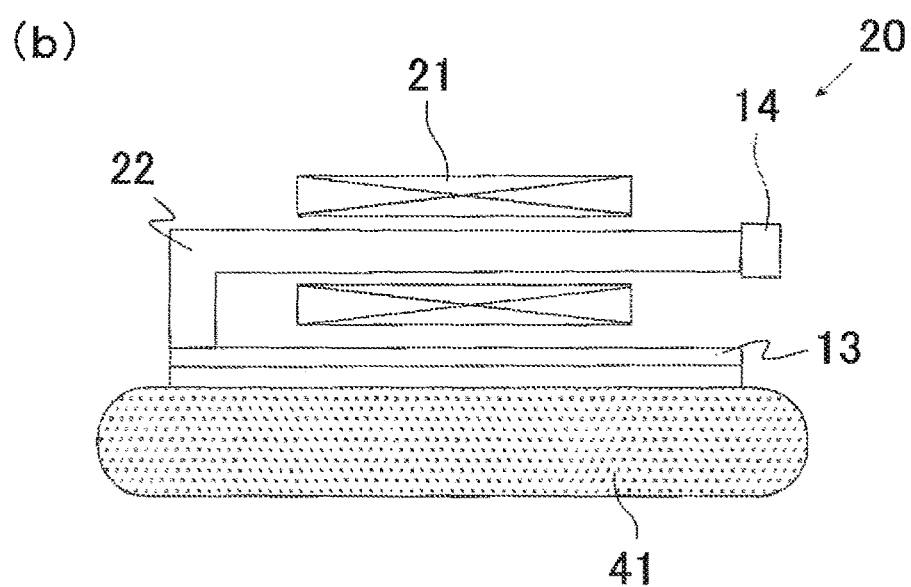
Figure 14:
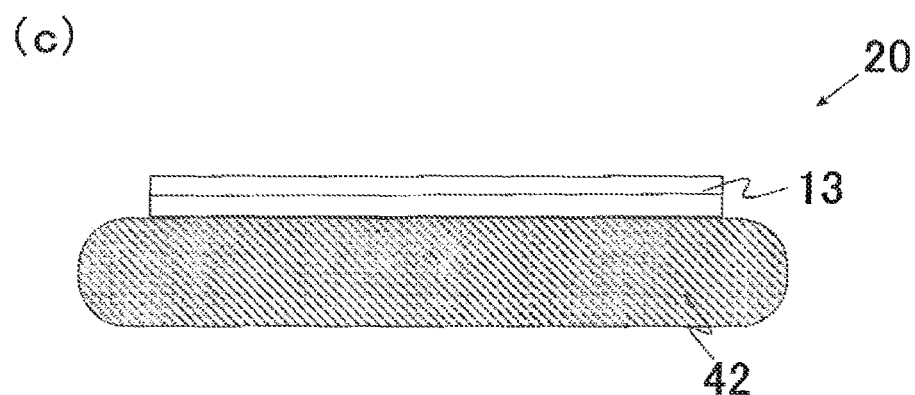

FIGS. 13 and 14 show an actuator 20 according to the embodiment of the present invention.

As shown in FIG. 13, the actuator 20 has a configuration similar to that of the vibration power generator 10 according to the embodiment of the present invention and includes a casing 11, a support 12, a vibration unit 13, a weight 14, a magnet 15, and a vibrating coil 21. In the following description, a structure same as that of the vibration power generator 10 according to the embodiment of the present invention will be given the same sign and the same explanation thereof will not be given repeatedly.

The vibrating coil 21 is arranged to pass the vibration unit 13 configured using the energy converter 1 through inside the vibrating coil 21 and located at the center and its vicinity of the vibration unit 13. The vibrating coil 21 is configured to vibrate the vibration unit 13 by means of the magnetostriction effect of the magnetostrictive material 3 in response to flow of a current.

In the actuator 20, when a current flows in the vibrating coil 21, the magnetization of the magnetostrictive material 3 is changed by the current. In this way, the magnetostriction effect of the magnetostrictive material 3 can be used for vibrating the vibration unit 13. In this case, the magnetization behavior of the soft magnetic material 2 and the magnetostriction phenomenon of the magnetostrictive material 3 produce synergic effect to achieve vibration efficiency higher than that achieved by using only the magnetostrictive material 3. Further, as the vibration unit 13 is formed by bonding the solid soft magnetic material 2 and the solid magnetostrictive material 3, nonuniformity in vibration characteristics is prevented compared to manufacture of the vibration unit 13 using a liquid material, making it possible to achieve intended and stable vibration characteristics.

As shown in FIG. 13, in the actuator 20, a vibration target 41 can be vibrated by being brought into contact with the weight 14 attached to the casing 11 or the tip of the vibration unit 13 as a cantilever.

As shown in FIG. 14(a), in the actuator 20, the weight 14 may be omitted and the vibration unit 13 may have a double supported beam shape (double-end beam, double-end fixed beam or double-end supported beam) in which the other end 13b of the vibration unit 13 is also fixed to a second support 12b. In this case, to transmit vibration efficiently to the vibration target 41, at least one of the support 12 to which the one end portion 13a of the vibration unit 13 is fixed and the second support 12b to which the other end portion 13b of the vibration unit 13 is fixed is preferably made of a material having elasticity.

As shown in FIG. 14(b), the actuator 20 may include a soft magnetic yoke 22 magnetically coupled to the vibration unit 13 and provided to extend from the vibration unit 13, and the vibrating coil 21 may be wound around the yoke 22 instead of being wound around the vibration unit 13. Also in this case, the vibration unit 13 can be vibrated through the yoke 22 by means of the magnetostriction effect of the magnetostrictive material 3. Additionally, the absence of the vibrating coil 21 around the vibration unit 13 allows insertion of the vibration unit 13 into a narrower place to allow vibration of the vibration target 41 located at a destination of the insertion.

The actuator 20 is available to any type of device accompanied by vibration. For example, the actuator 20 is available to an HMI attached to a handle or a seat of an automobile for preventing inattentive driving or drowsy driving, a vibration source for a vibration drill, a health appliance such as one for low-frequency therapy, a vibrator of a mobile phone, a vibration source for using a vibration target (wall, desk, cone, or paper cup) as a speaker, a buzzer, an alarm by means of vibration, a sound or vibration canceler such as a noise canceler or sound deadening speaker, a bug or vermin repelling unit to generate mosquito sound, an ultrasonic sonar, a fish finder, an earphone or a speaker of a bone conducting hearing aid, a foam maker for carbonated water or beer, a dust remover used in a pipe, an ultrasonic bath, an ultrasonic washer such as a dish washer or a cloth washing machine, a vibration source for a humidifier, a residual stress relaxing or impacting machine used in welding, a vibration pen, a vibration wiper for an automobile, a vibration motor, a carrier such as a pass feeder, a fender shield slider, a high-frequency tuning fork, an ultrasonic trigger point massager, an ultrasonic cutter, a controller for a TV game, a vibration alarm clock, an ion generator, a vaporizer, a vibration sieve, or vibration sources for these devices.

As shown in FIG. 14(c), the actuator 20 may be composed only of the vibration unit 13 configured using the energy converter 1. In this case, the vibration unit 13 can be vibrated by bringing the actuator 20 closer to in contact with a place where an electromagnetic field is fluctuating or an electromagnetic field fluctuating member 42 composed of a substance. Thus, by attaching the actuator 20 to the bottom of a pot or a frying pan and using the actuator 20 in an electromagnetic cooker corresponding to the electromagnetic field fluctuating member 42, for example, the bottom of the pot or frying pan is vibrated. In this way, burning can be prevented.

REFERENCE SIGNS LIST

1: Energy converter
1a: Cutout
2: Soft magnetic material
3: Magnetostrictive material
10: Vibration power generator
11: Casing
12: Support
13: Vibration unit
14: Weight
15: Magnet
16: Power generating coil
20: Actuator
21: Vibrating coil
22: Yoke
31: Pole
32: Neodymium magnet
41: Vibration target
42: Electromagnetic field fluctuating member

What is claimed is:

1. An energy converter comprising a structure formed by bonding a solid soft magnetic material and a solid magnetostrictive material by a method selected from the group consisting of thermal diffusion bonding, hot rolling process, hot drawing process, and clad rolling,
wherein the structure comprises a solid soft magnetic material, a solid magnetostrictive material, a region in which atoms of the solid magnetostrictive material have diffused into the solid soft magnetic material as a result of the bonding, and a region in which atoms of the solid soft magnetic material have diffused into the solid magnetostrictive material as a result of the bonding,
wherein the magnetostrictive material is made of an Fe—Co based alloy, an Fe—Al based alloy, Ni, an Ni—Fe based alloy, or an Ni—Co based alloy, and
wherein the solid soft magnetic material has a coercivity of 3 A/cm or less and the solid soft magnetic material is made of a magnetostrictive material having a magnetostriction constant of a different sign from a magnetostriction constant of the magnetostrictive material.

2. The energy converter according to claim 1, wherein one of the solid soft magnetic material and the magnetostrictive material is made of an Fe—Co based alloy or an Fe—Al based alloy having a positive magnetostriction constant, and the other is made of an alloy based on Ni and 0 to 20% by mass of Fe or an Ni—Co based alloy having a negative magnetostriction constant.

3. The energy converter according to claim 1, wherein the solid soft magnetic material and the magnetostrictive material are bonded under application of a load.

4. A vibration power generator comprising a vibration unit that comprises the energy converter according to claim 1, wherein the vibration power generator is configured to generate power by means of the inverse magnetostriction effect of the magnetostrictive material produced by the vibration of the vibration unit.

5. The vibration power generator according to claim 4, wherein the vibration unit has one or more parts at which stress concentration occurs in response to vibration.

6. A force sensor device comprising:
a sensor unit comprising the energy converter according to claim 1, and
a force detection unit that detects magnetization change resulting from the inverse magnetostriction effect of the magnetostrictive material produced when the sensor unit deforms, and determines force acting on the sensor unit on the basis of the detected magnetization change.

7. The force sensor device according to claim 6, wherein the force detection unit includes a magnetic sensor arranged in the vicinity of the magnetostrictive material, and is configured to detect the magnetization change as leakage flux using the magnetic sensor.

8. The force sensor device according to claim 6, wherein the force detection unit includes a detecting coil arranged in the vicinity of the magnetostrictive material, and is configured to detect the magnetization change as impedance change using the detecting coil.

9. The force sensor device according to claim 6, wherein the sensor unit has one or more parts at which stress concentration occurs in response to application of the force.

10. An actuator comprising:
a vibration unit that comprises the energy converter according to claim 1, and
a vibrating coil arranged to vibrate the vibration unit by means of the magnetostriction effect of the magnetostrictive material in response to flow of a current.

11. The actuator according to claim 10, wherein the vibrating coil is wound around the vibration unit or wound around a yoke magnetically coupled to the vibration unit.

12. The energy converter according to claim 1, wherein the soft magnetic material has a coercivity of 0.5 to 0.8 A/cm.

13. A method for preparing an energy converter, the method comprising:
bonding a solid soft magnetic material and a solid magnetostrictive material via thermal diffusion bonding, a hot rolling process, a hot drawing process, or clad rolling to form the energy converter,
wherein the bonding results in a structure comprising a solid soft magnetic material, a solid magnetostrictive material, a region in which atoms of the solid magnetostrictive material have diffused into the solid soft magnetic material as a result of the bonding, and a region in which atoms of the solid soft magnetic material have diffused into the solid magnetostrictive material as a result of the bonding,
wherein the magnetostrictive material is made of an Fe—Co based alloy, an Fe—Al based alloy, Ni, an Ni—Fe based alloy, or an Ni—Co based alloy, and
wherein the solid soft magnetic material is made of a magnetostrictive material having a magnetostriction constant of a different sign from a magnetostriction constant of the magnetostrictive material.

14. The method according to claim 13, wherein in the bonding step, the solid soft magnetic material is bonded to the solid magnetostrictive material via the thermal diffusion bonding.

15. The method according to claim 13, wherein in the bonding step, the solid soft magnetic material is bonded the solid magnetostrictive material via the hot rolling process.

16. The method according to claim 13, wherein in the bonding step, the solid soft magnetic material is bonded the solid magnetostrictive material via the hot drawing process.

17. The method according to claim 13, wherein in the bonding step, the solid soft magnetic material is bonded the solid magnetostrictive material via the clad rolling.

* * * * *